United States Patent [19]
Ochii et al.

[11] Patent Number: 5,281,843
[45] Date of Patent: Jan. 25, 1994

[54] THIN-FILM TRANSISTOR, FREE FROM PARASITIC OPERATION

[75] Inventors: Kiyofumi Ochii; Shigeyuki Hayakawa, both of Yokohama, Japan

[73] Assignee: Kabushiki Kaisha Toshiba, Kawasaki, Japan

[21] Appl. No.: 717,805

[22] Filed: Jun. 19, 1991

[30] Foreign Application Priority Data

Jun. 22, 1990 [JP] Japan ................... 2-164556

[51] Int. Cl.$^5$ ............... H01L 27/02; H01L 29/40; H01L 29/78; G11C 11/34
[52] U.S. Cl. ................... 257/393; 257/366; 257/630; 257/903; 257/904; 257/394; 365/154
[58] Field of Search ............ 357/41, 23.7, 4, 53, 357/23.14, 2, 59; 365/154, 182; 257/393, 67, 74, 394, 365, 366, 630, 903, 904

[56] References Cited

U.S. PATENT DOCUMENTS

| | | | |
|---|---|---|---|
| 4,566,025 | 1/1986 | Jastrzebski et al. | 357/23.14 |
| 4,853,894 | 8/1989 | Yamanaka et al. | 257/903 |
| 4,916,504 | 4/1990 | Nakahara | 357/23.7 |
| 4,996,575 | 2/1991 | Ipri et al. | 357/23.14 |
| 5,034,797 | 7/1991 | Yamanaka et al. | 257/904 |
| 5,079,615 | 1/1992 | Yamazaki et al. | 357/51 |

FOREIGN PATENT DOCUMENTS 2140972 5/1990 Japan .............. 357/23.14

OTHER PUBLICATIONS

IBM Technical Disclosure Bulletin, vol. 33, #1B, pp. 352-354, Jun. 1990 "Three-Dimensional, Six-Device, CMOS SRAM Cell Structure".

Primary Examiner—Mark V. Prenty
Attorney, Agent, or Firm—Finnegan, Henderson, Farabow, Garrett & Dunner

[57] ABSTRACT

First and second N-channel MOS transistors, each serving as a transfer gate, have their current paths connected, at their first ends, to bit lines, respectively, and their gates connected to a word line. Third and fourth N-channel MOS transistors, forming a flip-flop circuit, have their current paths connected, at their first ends, to the second ends of the current paths of the first and second transistors, respectively, and at their second ends, to a first power supply. The first ends of the current paths of the third and fourth transistors are connected to first ends of first and second thin-film transistors, respectively. The second ends of the current paths of the first and second thin-film transistors are connected to a second power supply. Each of the first and second thin-film transistors has first and second gates on both sides of its channel region. The first and second gates of the first thin-film transistor are connected to the gate of the fourth transistor, while the first and second gates of the second thin-film transistor are connected to the gate of the third transistor. Thus, the first and second thin-film transistors are supplied with a potential to render them nonconductive.

4 Claims, 6 Drawing Sheets

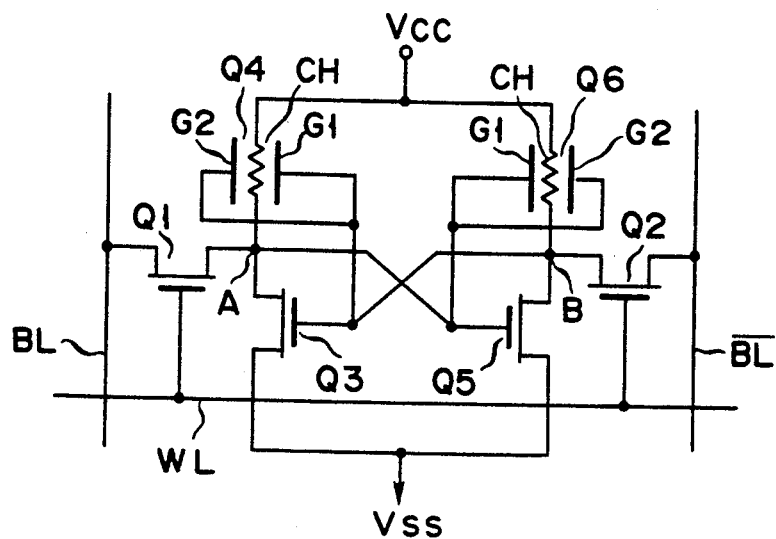
F I G. 1
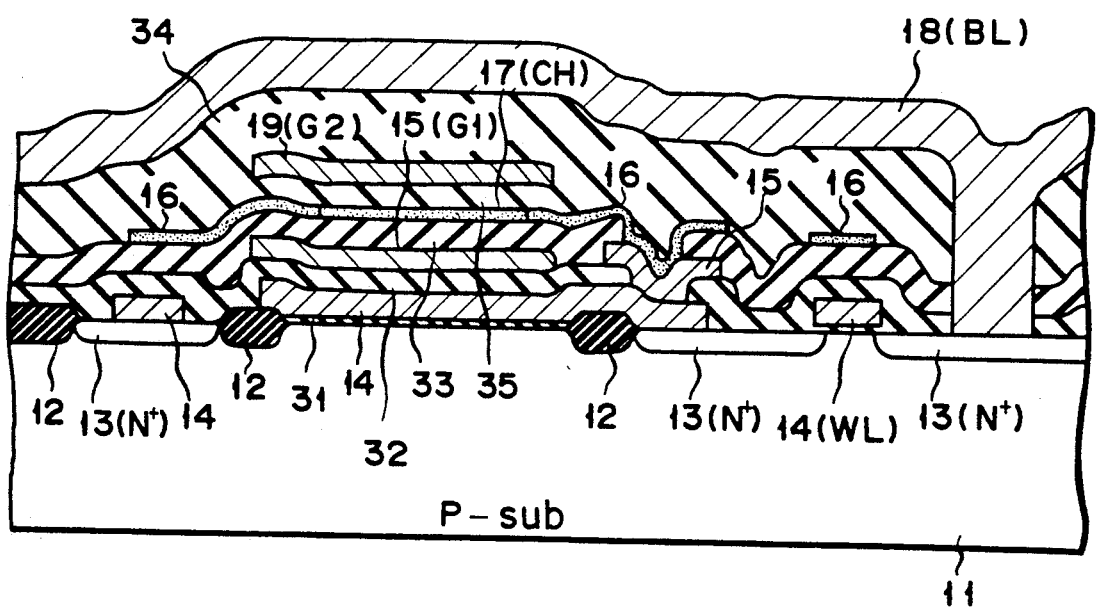
F I G. 3

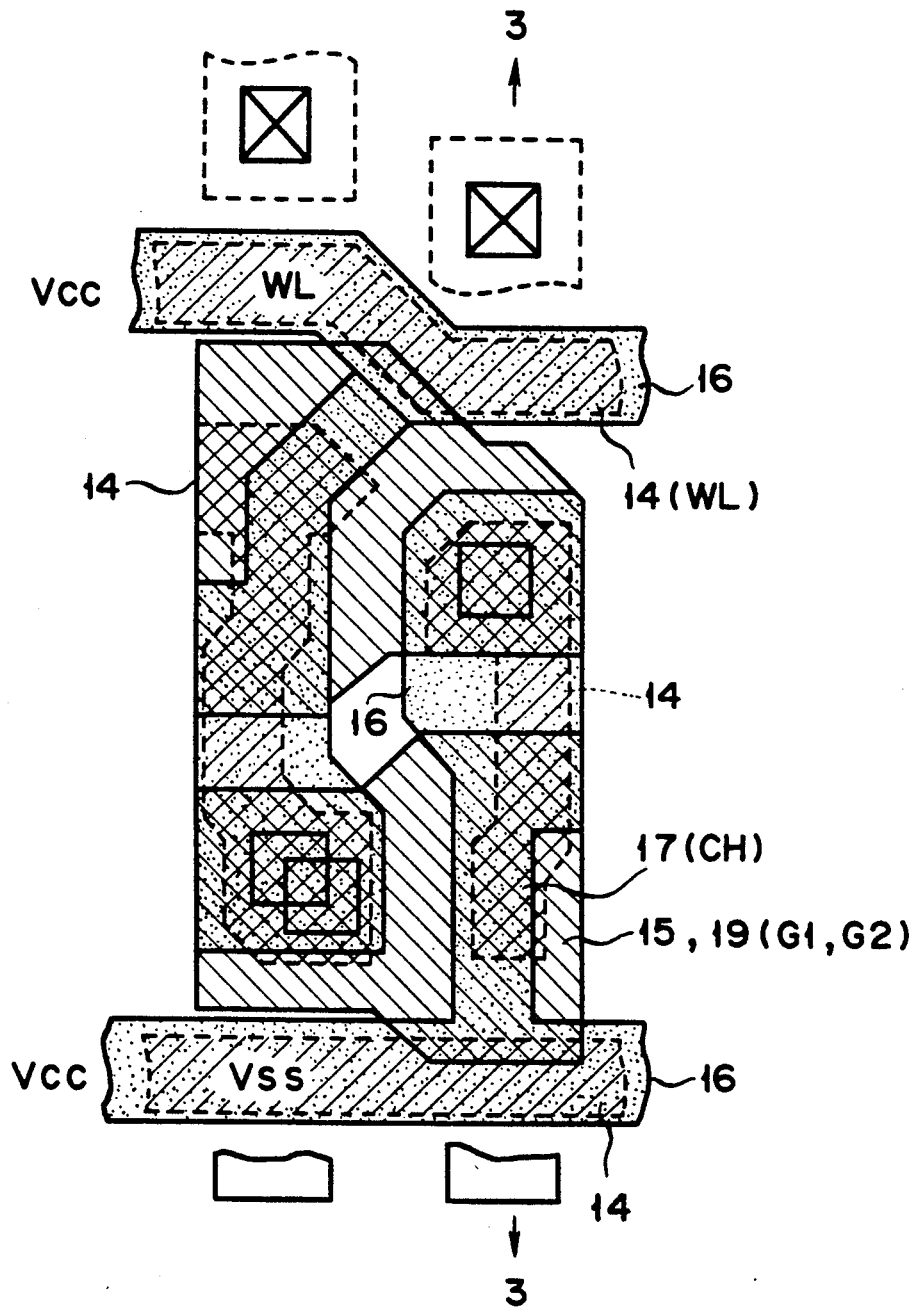
F I G. 2

THIN-FILM TRANSISTOR, FREE FROM PARASITIC OPERATION

BACKGROUND OF THE INVENTION

1. Field of the Invention

The present invention relates to a thin-film transistor which may be used as a load transistor in an SRAM (static random access memory) cell.

2. Description of the Related Art

High-density SRAM cells using thin-film transistors (TFTs) composed of thin films subsequently formed on a silicon substrate have been studied. With an SRAM cell which employs TFTs and which has been studied so far, a high-resistivity polysilicon layer which has conventionally been used as a load is replaced with a TFT.

FIG. 7 illustrates an equivalent circuit of a conventional SRAM cell which employs P-channel TFTs as loads.

In FIG. 7, N-channel MOS transistors Q1 and Q2, which serve as transfer gates, have their current paths connected, at their corresponding ends, to bit lines BL and BL, respectively, and at the other ends, to storage nodes A and B, respectively. The gate of each of the transistors Q1 and Q2 is connected to a word line WL. To the storage node A are connected the drains of an N-channel MOS transistor Q3 and a P-channel TFT Q4. The gates of the transistor Q3 and TFT Q4 are connected to the storage node B. The source of the transistor Q3 is connected to ground potential Vss, while the source of the TFT Q4 is connected to a supply potential Vcc. In a similar manner, an N-channel MOS transistor Q5 and a P-channel TFT Q6 have their drains connected to the storage node B and their gates connected to the storage node A. The source of the transistor Q5 is connected to ground potential Vss, while the source of the TFT Q6 is connected to the supply potential Vcc.

In the above SRAM cell, the transistor Q3 and TFT Q4 constitute one complementary MOS (CMOS) inverter, while the transistor Q5 and TFT Q6 constitute one CMOS inverter. Each of the TFTs Q4 and Q6 serves as a load transistor of the CMOS inverter.

FIG. 8 illustrates a pattern layout of the SRAM shown in FIG. 7, and FIG. 9 is a sectional view taken along the line 9—9 of FIG. 8. In FIGS. 8 and 9, 11 denotes a P-type semiconductor substrate, 12 denotes field insulating layers formed within the semiconductor substrate 11, and 13 denotes N+ diffused regions which are formed within the semiconductor substrate 11 which serve as source regions or drain regions of the N-channel MOS transistors. Note that, in FIG. 8, the N+ diffused regions 13 described above, and the gate oxide films and insulating layers to be described later are omitted. Reference numeral 14 denotes a first layer of polysilicon serving as gate electrodes of the N-channel MOS transistors, which is isolated from the semiconductor substrate 11 by an oxide film 31. Reference numeral 15 denotes a second layer of polysilicon serving as the gate electrode of a P-channel TFT, which is isolated from the first polysilicon layer 14 by an insulating layer 32. Reference numeral 16 denotes a third layer of polysilicon which serves as the channel region, source region and drain region of a P-channel TFT. The polysilicon layer 16 is isolated from the gate electrode layer 15 by an insulating layer 33. Reference numeral 17 denotes the channel region of a TFT which is formed in the third polysilicon layer 16 and is substantially undoped with impurities so that it remain highly resistive. The word line WL and ground line are formed of the first polysilicon layer 14, and the power supply line for supplying the potential Vcc is formed of the third polysilicon layer 16. An interlayer insulating film 34 is formed over the resultant structure. A metal line 18, which serves as the bit line BL, is formed on the interlayer insulating film 34 and connected to the N+ diffusion region 13.

In FIG. 8, the N+ diffusion region is omitted.

As shown in FIG. 9, the TFT is composed of the gate electrode layer 15 and the polysilicon layer 16 disposed above the layer 15. The channel region 17 is provided in that portion of the polysilicon layer 16 which corresponds to the gate electrode 15. In contrast to a usual field effect transistor using silicon, the TFT has its gate electrode, source and drain regions reversed in position. Thus, the TFT is not of a self-alignment type.

The TFT uses a thin polysilicon layer whose thickness is on the order of some hundreds of angstroms. Thus, if a contact hole were opened in this thin polysilicon layer, the underlying polysilicon layer would also be etched away.

The metal line 18, which normally serves as the bit line BL, is formed above the thin polysilicon layers constituting the TFT. Separation is made between the metal line 18 and the polysilicon layer 16 by the relatively thick interlayer insulating layer 34 of the order of some thousands of angstroms. However, the metal line 18 may serve as a gate electrode for the polysilicon layer 16, thereby constituting a parasitic TFT. The potential on the metal line 18 serving as the bit line varies between read and write operations. Thus, a variation in the potential on the bit line will allow a parasitic operation which causes the on or off state of the P-channel TFT to be changed. At the time of writing of data in particular, one of the paired bit lines goes to a low level to cause the P-channel TFT to turn on. This results in an increase in the current of a memory cell when it is in the quiescent state. The on current of the parasitic TFT resulting from the metal line 18 is very small because of the relatively thick gate layer. However, the on current has a great influence upon the extremely-low leakage current characteristic of the SRAM when it is in the quiescent state.

Where, in the future, a semiconductor device of a three-dimensional structure is developed by forming TFTs upon each other, a TFT parasitic gate electrode will be developed in its upper or lower layer. Therefore, it is expected that the influence of the parasitic gate electrode will become an even more serious problem.

SUMMARY OF THE INVENTION

It is the object of the present invention to provide a thin-film transistor which permits a parasitic gate electrode of a TFT that is formed by a connection line which overlies or underlies the TFT to be eliminated and a parasitic operation of the TFT to be avoided.

The above object is attained by a thin-film transistor comprising:

a semiconductor substrate;

a first thin film formed above the semiconductor substrate to be isolated therefrom and serving as a first gate electrode;

a second thin film formed above the first thin film to be isolated therefrom and containing a channel region corresponding to the first gate electrode; and a third thin film formed above the second thin film to be isolated therefrom and serving as a second gate electrode, at least one of the first and second gate electrodes being supplied with enough potential to render the thin-film transistor nonconductive.

According to the present invention, a first thin film serving as a first gate electrode and a third thin film serving as a second gate electrode are formed on both sides of a second thin film containing a channel region, and at least one of the first and second gate electrodes is supplied with enough potential to render a thin-film transistor non-conductive. Therefore, the thin-film transistor can be shielded from electric fields from other connection lines, thereby eliminating a parasitic gate electrode of the TFT and avoiding the parasitic operation of the TFT.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is an equivalent circuit diagram of a memory cell structure according to a first embodiment of the present invention;

FIG. 2 is a plan view of the cell structure of FIG. 1;

FIG. 3 is a sectional view taken along the line 3—3 of FIG. 2;

DETAILED DESCRIPTION OF THE PREFERRED EMBODIMENTS

Figure 7:
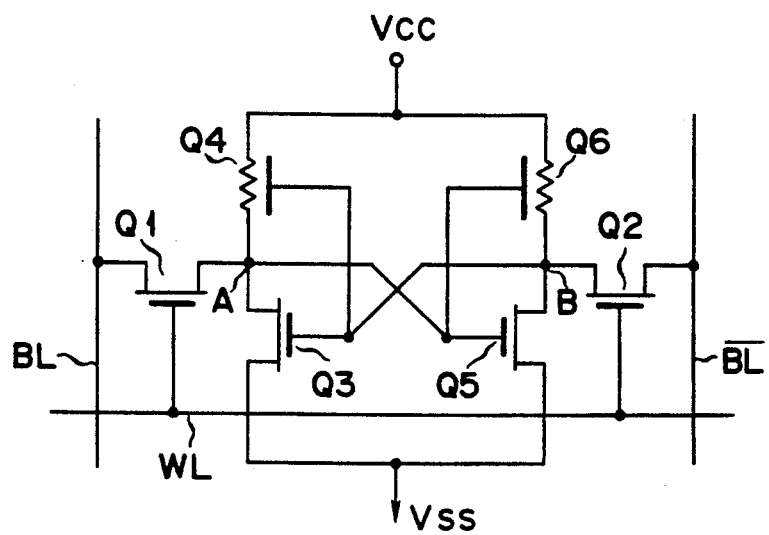
FIG. 7 is an equivalent circuit diagram of a conventional SRAM cell.
Figure 9:
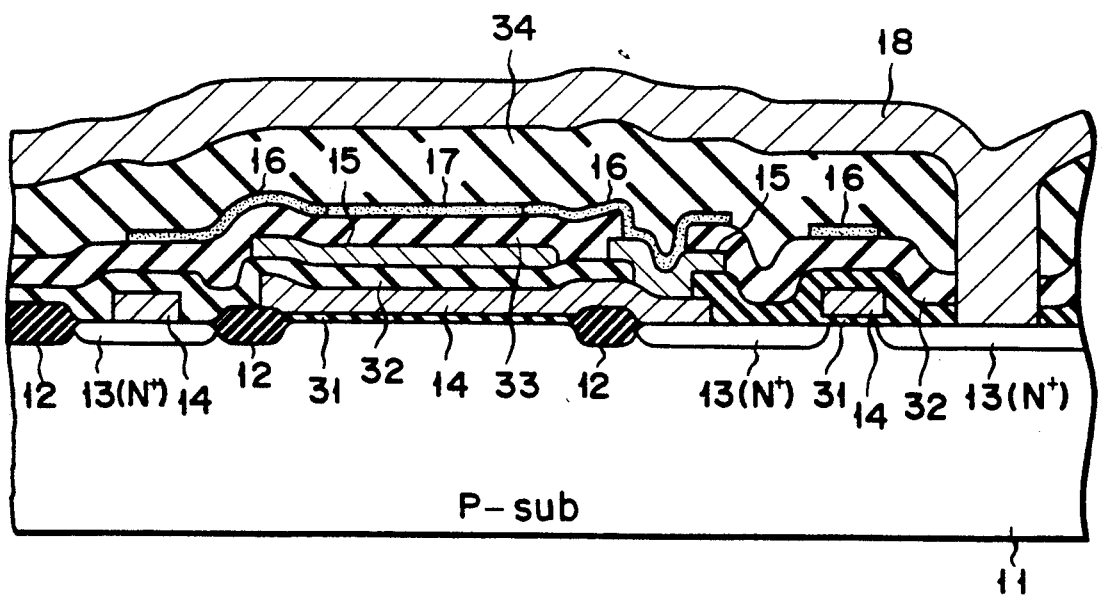
FIG. 9 is a sectional view taken along the line 9—9 of FIG. 8.
Figure 8:
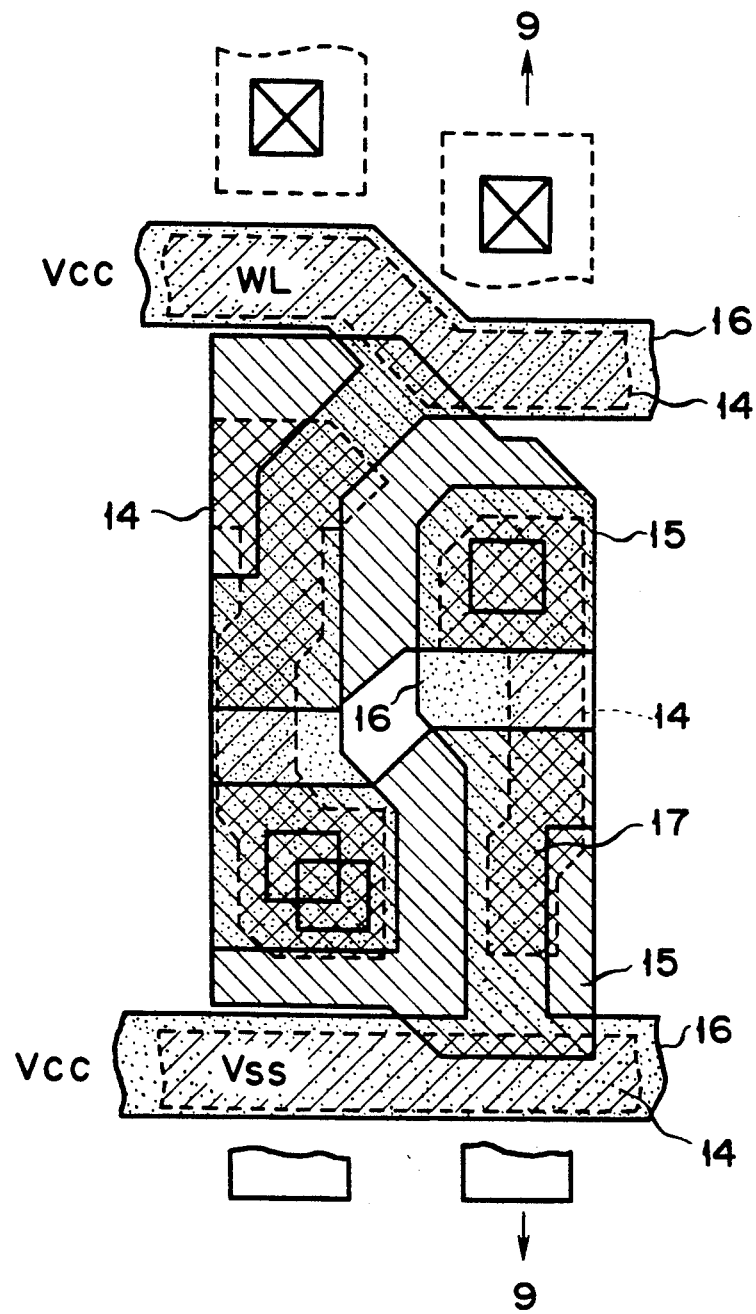
FIG. 8 is a plan view of the cell structure of FIG. 7.

Hereinafter a first embodiment of the present invention will be described with reference to FIGS. 1 through 3 in which like reference numerals are used to denote corresponding parts to those in FIGS. 7 to 9.

In FIG. 1, N-channel MOS transistors Q1 and Q2, which serve as transfer gates, have their respective current paths connected, at their corresponding ends, to bit lines BL and BL and, at the other corresponding ends, to storage nodes A and B. The gates of the transistors Q1 and Q2 are connected to a word line WL. A storage node A is connected to the drain of each of the N-channel MOS transistor Q3 and P-channel TFT Q4. A storage node B is connected to the drain of each of the N-channel MOS transistor Q5 and P-channel TFT Q6. The transistor Q3 has its gate connected to the storage node B and its source connected to ground potential Vss. The transistor Q5 has its gate connected to the storage node A and its source connected to ground potential Vss.

The source of each of the TFTs Q4 and Q6 is connected to power supply potential Vcc. Each of these TFTs Q4 and Q6 has first and second gate electrodes G1 and G2 on both sides of its channel region CH. The gate electrodes G1 and G2 of TFT Q4 are both connected to the gate electrode of the transistor Q3 and to the storage node B, while the gate electrodes G1 and G2 of the TFT Q6 are both connected to the gate electrode of the transistor Q5 and to the storage node A. The gate electrodes G1 and G2 of the TFT Q4 are supplied with the potential at the storage node B, while the gate electrodes G1 and G2 of the TFT Q6 are supplied with the potential at the storage node A.

FIG. 2 illustrates a pattern layout of the SRAM, and FIG. 3 is a sectional view taken along the line 3—3 of FIG. 2.

In FIGS. 2 and 3, 11 designates a P-type semiconductor substrate, 12 designates a field insulating layer formed in the semiconductor substrate 11, and 13 designates N+ diffusion regions which are formed within the semiconductor substrate 11 and which serve as the source region or drain region of an N-channel MOS transistor. Note that, in FIG. 2, the N+ diffusion regions 13, and a gate oxide film, insulating layers, etc., which are to be described later are omitted. Reference numeral 14 designates a first layer of polysilicon which serves as the gate electrode of an N-channel MOS transistor. This polysilicon layer is isolated from the semiconductor substrate 11 by an oxide film 31. Reference numeral 15 designates a second layer of polysilicon which serves as the first gate electrode G1 of the P-channel TFT and which is isolated from the polysilicon layer 14 by an insulating layer 32. Reference numeral 16 designates a third layer of polysilicon which serves as the channel region and source and drain regions of the P-channel TF and which is isolated from the gate electrode layer 15 by an insulating layer 33. Reference numeral 17 designates the channel region of the TFT that is formed in the third layer 16 of polysilicon. The channel region 17 is substantially not doped with impurities, so that it remains highly resistive. Reference numeral 19 designates a fourth layer of polysilicon which serves as the second gate electrode G2 of the P-channel TF and which is isolated from the polysilicon layer 16 by an insulating layer 35. An interlayer insulating layer 34 is formed over the resultant structure. A metal line 18 serving as a bit line BL is formed on the interlayer insulating layer 34. The metal line 18 is connected to the N+ diffusion region 13.

The second gate electrode G2 is placed at the same potential as the first gate electrode G1. Each of the insulating layers 33 and 35 is a gate oxide layer which has such a thickness as to produce the field effect on the TFT layer.

Each of the world line WL and ground line employs the first layer 14 of polysilicon. The line adapted to supply the supply voltage Vcc employs the third layer 6 of polysilicon.

With such a configuration as described above, each of the TFTs Q4 and Q6 is of a dual gate structure having first and second gates G1 and G2, which are supplied with an equal potential. Thus, the TFTs Q4 and Q6 are shielded from electric fields from other lines, such as bit lines, etc., by the first and second gates G1 and G2, thereby eliminating the TFT parasitic gate electrodes completely and avoiding the parasitic operation due to the parasitic gate electrodes.

Moreover, according to the above configuration, the conductance of the TFT when it is turned on can be increased and the cutoff current when it is turned off can be minimized. Thus, the characteristics of the SRAM can be improved significantly.

Furthermore, according to the above configuration, in the case as well where a semiconductor device of a three-dimensional structure in which TFTs are formed upon each other is developed in the future, the parasitic gates of the TFTs can be eliminated and thus the parasitic operation due to the parasitic gates can be avoided.

Next, a second embodiment of the present invention will be described with reference to FIGS. 4 and 5 in which like reference numerals are used to designate corresponding parts to those in FIGS. 2 and 3.

Figure 5:
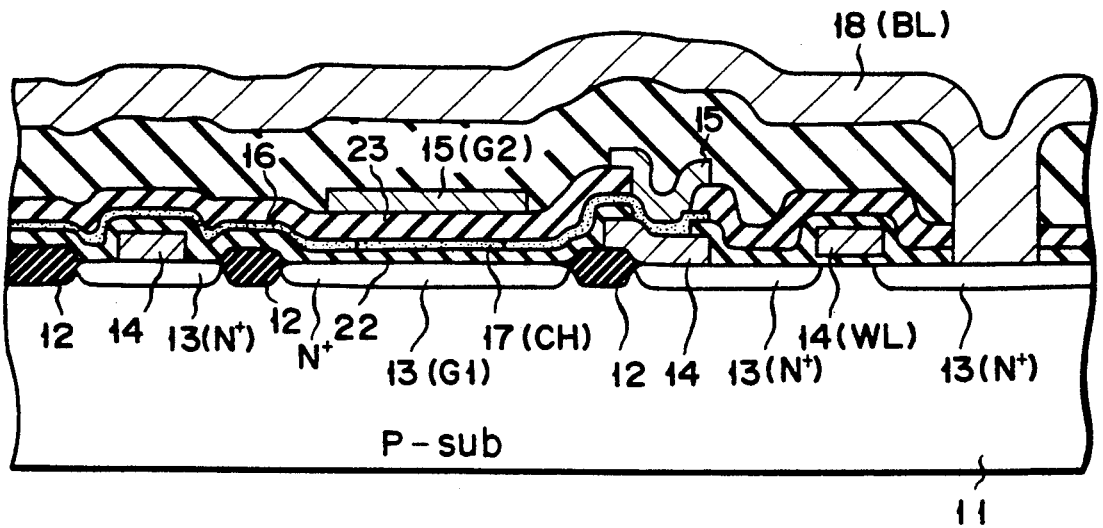
FIG. 5 is a sectional view taken along the line 5—5 of FIG. 4.

In the case of the second embodiment, N+ diffusion layer 13 is used as the first gate electrode G1 of the TFT as indicated in FIG. 5. A gate oxide film 22 is formed on the N+ diffusion layer 13. A polysilicon layer 16 containing a channel region 17 is formed on the gate oxide film 22. Above the polysilicon layer 16 is formed a polysilicon layer 15 forming the second gate electrode G2 with a gate oxide layer 23 interposed therebetween.

Figure 4:
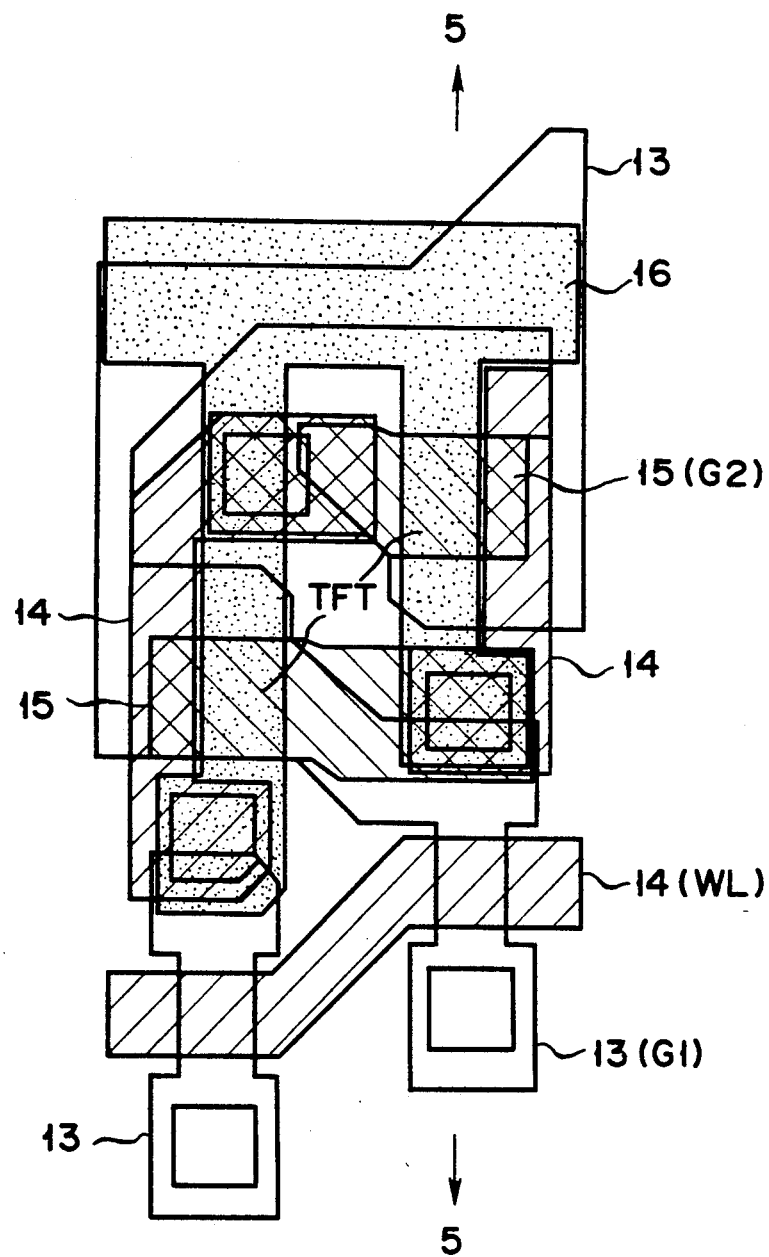
FIG. 4 is a plan view of a memory cell structure according to a second embodiment of the present invention which is represented by the same equivalent circuit diagram as that of FIG. 1.

Note that, in FIG. 4, the gate oxide layers 22 and 23 are not indicated.

The second embodiment can also provide the same advantage as the first embodiment. In addition, the second embodiment can decrease the number of polysilicon layers in comparison with the first embodiment, thus decreasing the manufacturing steps.

Figure 6:
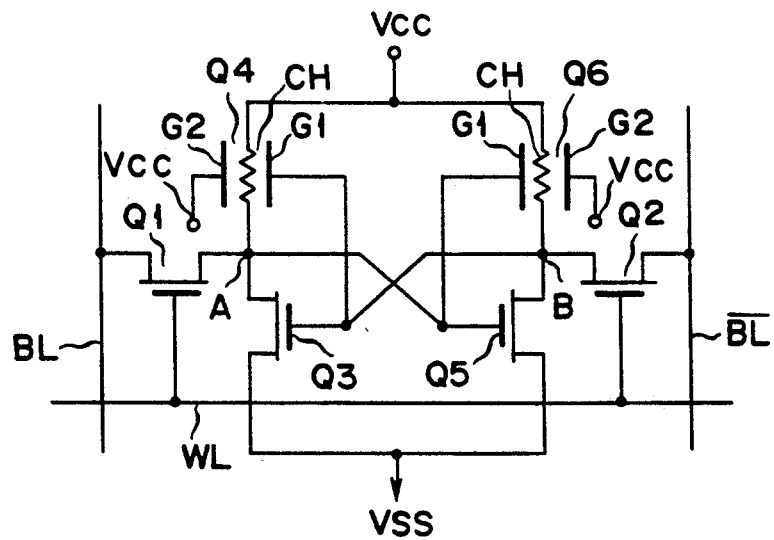
FIG. 6 is an equivalent circuit diagram of a memory cell according to a third embodiment of the present invention.

FIG. 6 illustrates a third embodiment of the present invention. In FIG. 6, like reference numerals are used to designate corresponding parts to those in FIG. 1.

In this embodiment, the second gate electrodes G2 of the P-channel TFTs are each biased at the potential Vcc so that they are rendered nonconductive. This can eliminate the TFT parasitic operation.

Although, in the first and second embodiments, polysilicon is used to form the thin film, amorphous silicon may be used instead. Moreover, the thin film may be formed of monocrystalline silicon. In this case monocrystalline silicon need not be formed into the thin film.

The above embodiments were described taking an SRAM cell by way of example. Of course, the present invention need not be limited to the SRAM cell and may be applied to some other cell.

Although the preferred embodiments of the present invention have been disclosed and described, it is apparent that other embodiments and modifications are possible.

What is claimed is:

1. A semiconductor memory device, using a thin-film transistor as a load, comprising:

first and second insulated gate transistors of a first conductivity type each having a current path and a gate, first ends of said current paths of said first and second insulated gate transistors being respectively connected to bit lines, and said gates of said first and second insulated gate transistors being connected to a word line;

third and fourth insulated gate transistors of said first conductivity type, each having a current path and a gate, first ends of said current paths of said third and fourth insulated gate transistors being respectively connected to second ends of said current paths of said first and second insulated gate transistors, second ends of said current paths of said third and fourth insulated gate transistors being connected to a first power supply, said gate of said third insulated gate transistor being connected to said second end of said current path of said second insulated gate transistor, and said gate of said fourth insulated gate transistor being connected to said second end of said current path of said first insulated gate transistor; and first and second thin-film transistors of a second conductivity type each having a current path, and respectively having first and second channel regions, first ends of said current paths of said first and second thin-film transistors being connected to said first ends of said third and fourth insulated gate transistors, second ends of said current paths of said first and second thin-film transistors being connected to a second power supply, said first thin-film transistor having first and second gates respectively above and below said first channel region, said second thin-film transistor having third and fourth gates respectively above and below said second channel region, said second gate being connected to said gate of said third insulated gate transistor, said fourth gate being connected to said gate of said fourth insulated gate transistor, and said first and third gates being connected to said second power supply.

2. A memory device according to claim 1, in which said first and second thin-film transistors are formed of polysilicon.

3. A memory device according to claim 1, in which said first and second thin-film transistors are formed of amorphous silicon.

4. A random access memory device, using a thin-film transistor as a load, comprising:

first and second insulated gate transistors of a first conductivity type each having a current path and a gate, first ends of said current paths of said first and second insulated gate transistors being respectively connected to bit lines, and said gates of said first and second insulated gate transistors being connected to a word line;

third and fourth insulated gate transistors of said first conductivity type, each having a current path and a gate, first ends of said current paths of said third and fourth insulated gate transistors being respectively connected to second ends of said current paths of said first and second insulated gate transistors, second ends of said current paths of said third and fourth insulated gate transistors being connected to a first power supply, said gate of said third insulated gate transistor being connected to said second end of said current path of said second insulated gate transistor, and said gates of said fourth insulated gate transistor being connected to said second end of said current path of said first insulated gate transistor; and first and second thin-film transistors of a second conductivity type each having a current path, and respectively having first and second channel regions, first ends of said current paths of said first and second thin-film transistors being connected to said first ends of said third and fourth insulated gate transistors, second ends of said current paths of said first and second thin-film transistors being connected to a second power supply, said first thin-film transistor having first and second gates respectively above and below said first channel region, said second thin-film transistor having third and fourth gates respectively above and below said second channel region, said second gate being connected to said gate of said third insulated gate transistor, said fourth gate being connected to said gate of said fourth insulated gate transistor, and said first and third gates being connected to said second power supply.

* * * * *